United States Patent
Shinada et al.

(10) Patent No.: US 11,664,207 B2
(45) Date of Patent: May 30, 2023

(54) FILM-FORMING APPARATUS, FILM-FORMING SYSTEM, AND FILM-FORMING METHOD

(71) Applicant: TOKYO ELECTRON LIMITED, Tokyo (JP)

(72) Inventors: Masato Shinada, Tokyo (JP); Hiroyuki Toshima, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 459 days.

(21) Appl. No.: 16/531,782

(22) Filed: Aug. 5, 2019

(65) Prior Publication Data

US 2020/0051796 A1 Feb. 13, 2020

(30) Foreign Application Priority Data

Aug. 10, 2018 (JP) ............................. JP2018-151673
Nov. 28, 2018 (JP) ............................. JP2018-222067

(51) Int. Cl.
*C23C 14/34* (2006.01)
*H01J 37/34* (2006.01)
(Continued)

(52) U.S. Cl.
CPC .......... *H01J 37/3417* (2013.01); *C23C 14/34* (2013.01); *C23C 14/505* (2013.01);
(Continued)

(58) Field of Classification Search
CPC ....... C23C 14/04; C23C 14/226; C23C 14/34; C23C 14/3464; C23C 14/505;
(Continued)

(56) References Cited

U.S. PATENT DOCUMENTS 5,567,288 A * 10/1996 Fukutomi ............. C30B 23/002
204/298.11
5,597,462 A * 1/1997 Cho .................... H01J 37/3447
204/298.11
(Continued)

FOREIGN PATENT DOCUMENTS

JP 06-093426 A 4/1994
JP 2000-129436 A 5/2000
(Continued)

OTHER PUBLICATIONS

Machine Translation JP 2010-126789 (Year: 2010).*

*Primary Examiner* — Rodney G McDonald
(74) *Attorney, Agent, or Firm* — Nath, Goldberg & Meyer; Jerald L. Meyer; Tanya E. Harkins

(57) ABSTRACT

A film-forming apparatus comprises: a processing chamber defining a processing space, a first sputter-particle emitter and a second sputter-particle emitter having targets, respectively, from which sputter-particles are emitted in different oblique directions in the processing space, a sputter-particle blocking plate having a passage hole through which the sputter particles emitted from the first sputter-particle emitter and the second sputter-particle emitter pass, a substrate support configured to support a substrate and provided at a side opposite the first sputter-particle emitter and the second sputter-particle emitter with respect to the sputter-particle blocking plate in the processing space, a substrate moving mechanism configured to linearly move the substrate supported on the substrate support, and a controller configured to control the emission of sputter-particles from the first sputter-particle emitter and the second sputter-particle emitter while controlling the substrate moving mechanism to move the substrate linearly.

10 Claims, 17 Drawing Sheets

(51) Int. Cl.
*C23C 14/50* (2006.01)
*H01L 21/67* (2006.01)
*H01L 21/677* (2006.01)

(52) U.S. Cl.
CPC ...... *H01J 37/3429* (2013.01); *H01J 37/3435* (2013.01); *H01J 37/3447* (2013.01); *H01J 2237/026* (2013.01); *H01J 2237/20214* (2013.01); *H01J 2237/20228* (2013.01); *H01J 2237/332* (2013.01); *H01L 21/67167* (2013.01); *H01L 21/67196* (2013.01); *H01L 21/67207* (2013.01); *H01L 21/67742* (2013.01)

(58) Field of Classification Search
CPC ... C23C 14/54; C23C 14/566; C23C 14/5873; H01J 37/3447; H01J 37/3417; H01J 37/3429; H01J 37/3435; H01J 2237/026; H01J 2237/20214; H01J 2237/20228; H01J 2237/332; H01L 21/6719; H01L 21/67742; H01L 21/68764; H01L 21/68785; H01L 21/67167; H01L 21/67196; H01L 21/67207
USPC ............................. 204/298.11, 298.18, 192.12
See application file for complete search history.

(56) References Cited

U.S. PATENT DOCUMENTS

| 10,392,688 | B2 | 8/2019 | Takei et al. | |
|---|---|---|---|---|
| 2005/0034979 | A1* | 2/2005 | Druz | C23C 14/044 204/298.02 |
| 2006/0054494 | A1 | 3/2006 | Reiss | |
| 2012/0103802 | A1* | 5/2012 | Cheong | C23C 14/562 204/298.11 |
| 2013/0299345 | A1 | 11/2013 | Abarra et al. | |
| 2019/0189465 | A1* | 6/2019 | Miller | H01L 21/68735 |
| 2020/0043711 | A1 | 2/2020 | Toshima et al. | |
| 2020/0048759 | A1 | 2/2020 | Shinada et al. | |
| 2020/0051796 | A1 | 2/2020 | Shinada et al. | |

FOREIGN PATENT DOCUMENTS

| JP | 2004-70131 A | | 3/2004 |
|---|---|---|---|
| JP | 2005-256032 A | | 9/2005 |
| JP | 2010-126789 | * | 6/2010 |
| JP | 4473343 B | | 6/2010 |
| JP | 2015-67856 A | | 4/2015 |
| JP | 2016-033266 A | | 3/2016 |
| KR | 1020010051306 A | | 6/2001 |
| WO | 2011058812 A1 | | 5/2011 |

* cited by examiner

FILM-FORMING APPARATUS, FILM-FORMING SYSTEM, AND FILM-FORMING METHOD

CROSS-REFERENCE TO RELATED APPLICATIONS

This application is based upon and claims the benefit of priority from Japanese Patent Application No. 2018-151673, filed on Aug. 10, 2018, and Japanese Patent Application No. 2018-222067, filed on Nov. 28, 2018, the entire contents of which are incorporated herein by reference.

TECHNICAL FIELD

The present disclosure relates to a film-forming apparatus, a film-forming system, and a film-forming method.

BACKGROUND

In the manufacture of electronic devices such as semiconductor devices, a film-formation process is performed to form a film on a substrate. As a film-forming apparatus used for the film-forming process, a sputtering apparatus is known.

A technology for sputter-particles to be obliquely incident on a substrate has been proposed in Patent Document 1 as a technology for realizing highly directional film formation in which the incident direction of sputter-particles is aligned with respect to a pattern on the substrate.

A film-forming apparatus includes a vacuum chamber, a substrate holding stage provided in the vacuum container, a target holder configured to hold a target, and a shielding assembly provided between the target holder and the substrate holding stage and having an opening (a passage hole). While moving the substrate holder using a movement mechanism, sputter-particles are incident on the substrate at a predetermined angle by passing the sputter-particles emitted from the target through the opening in the shielding assembly.

PRIOR ART DOCUMENTS

Patent Documents

Patent Document 1: Japanese laid-open publication No. 2015-67856

SUMMARY

According to one embodiment of the present disclosure there is provided a film-forming apparatus comprises a processing chamber defining a processing space in which a film-forming process is performed on a substrate, a first sputter-particle emitter and a second sputter-particle emitter having targets, respectively, from which sputter-particles are emitted in different oblique directions in the processing space, a sputter-particle blocking plate having a passage hole through which the sputter particles emitted from the first sputter-particle emitter and the second sputter-particle emitter pass, a substrate support configured to support the substrate and provided at a side opposite the first sputter-particle emitter and the second sputter-particle emitter with respect to the sputter-particle blocking plate in the processing space, a substrate moving mechanism configured to linearly move the substrate supported on the substrate support, and a controller configured to control the first sputter-particle emitter, the second sputter-particle emitter, and the substrate moving mechanism, wherein the controller is configured to control the emission of sputter-particles from the first sputter-particle emitter and the second sputter-particle emitter while controlling the substrate moving mechanism to move the substrate linearly, and wherein the sputter-particles emitted from the first sputter-particle emitter and the second sputter-particle emitter pass through the passage hole and are deposited on the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments will be described in detail with reference to the accompanying drawings.

First Embodiment

Figure 1:
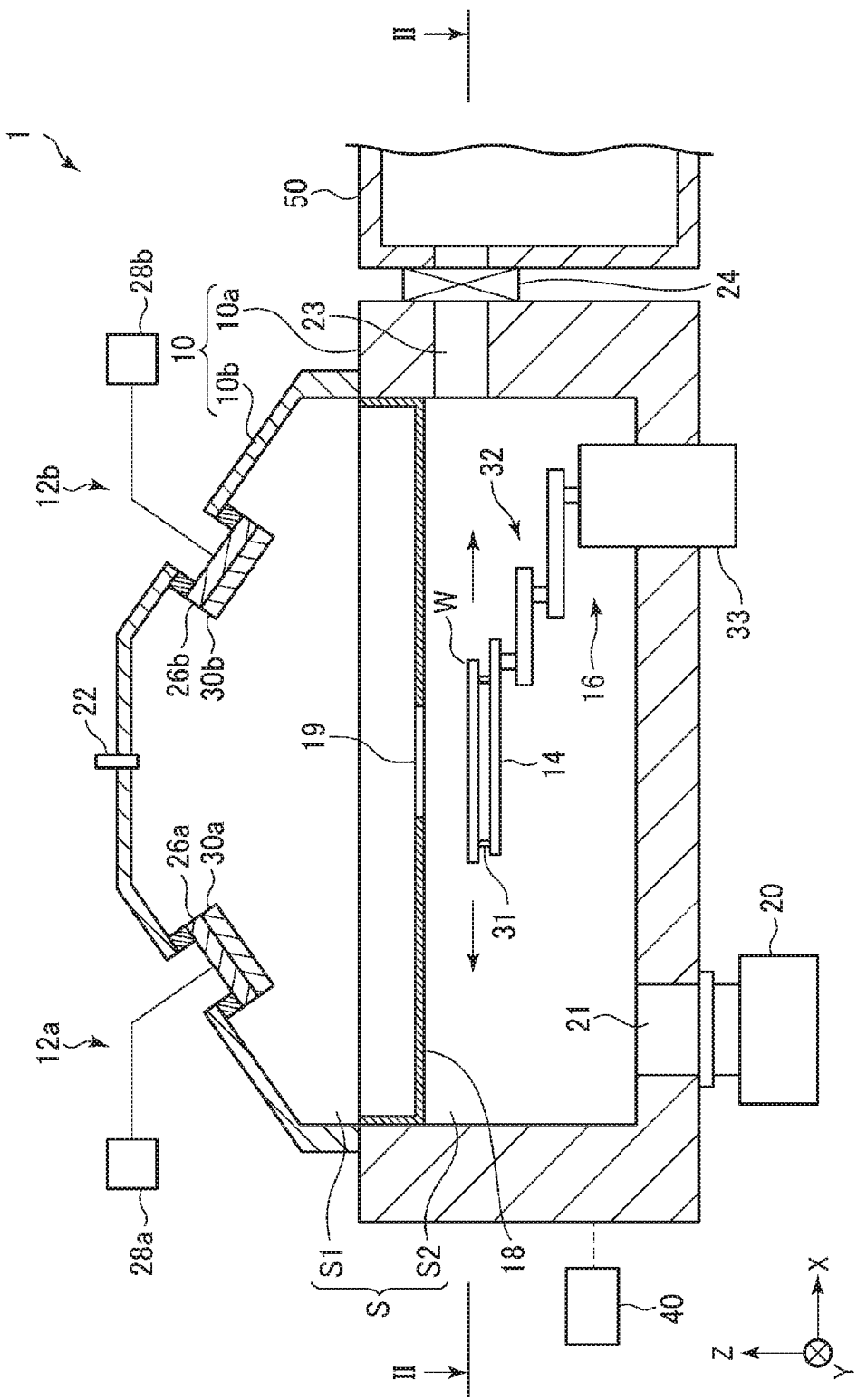
FIG. 1 is a vertical cross-sectional view illustrating a film-forming apparatus according to an embodiment.
Figure 2:
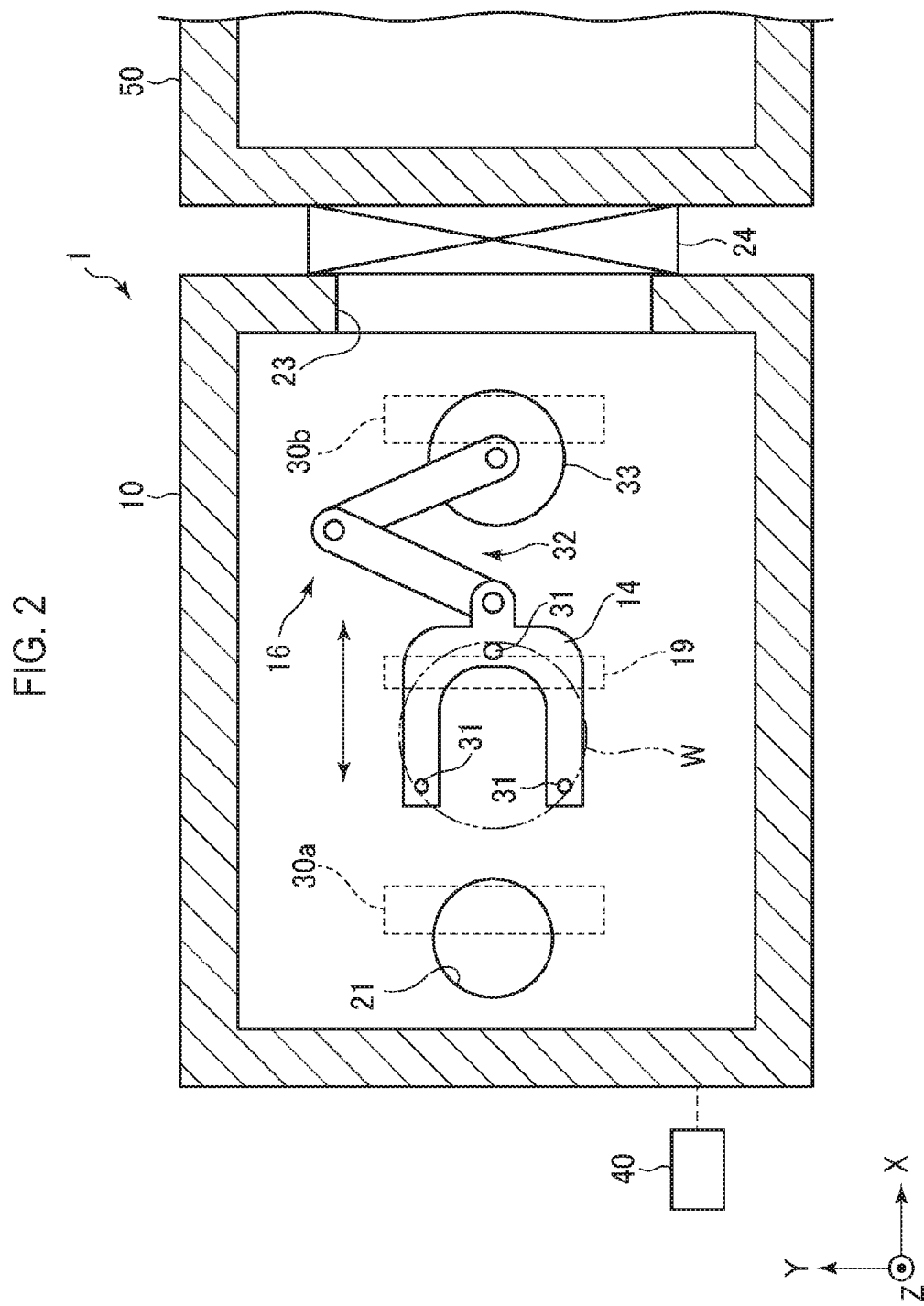
FIG. 2 is a horizontal cross-sectional view taken along line II-II in FIG. 1.

A first embodiment will be described first.
[Film-Forming Apparatus]
FIG. 1 is a vertical cross-sectional view illustrating a film-forming apparatus used in a first embodiment, and FIG. 2 is a horizontal cross-sectional view taken along line II-II in FIG. 1.

The film-forming apparatus 1 forms a film on a substrate W by sputtering. The film-forming apparatus 1 includes a processing chamber 10, first and second sputter-particle emitters 12a and 12b, a substrate support 14, a substrate moving mechanism 16, a sputter-particle blocking plate 18, and an exhaust device 20. The substrate W may be, for example, a semiconductor wafer, but is not limited thereto.

The processing chamber 10 has a chamber body 10a having an upper opening, and a lid 10b provided to close the upper opening of the chamber body 10a. The lid 10b has an inclined side surface. The inside of the processing chamber 10 is a processing space S in which a film-forming process is performed.

An exhaust port 21 is formed at the bottom of the processing chamber 10, and the exhaust device 20 is connected to the exhaust port 21. The exhaust device 20 includes a pressure control valve and a vacuum pump. The exhaust device 20 is configured to evacuate the processing space S to a predetermined degree of vacuum.

At the top of the processing chamber 10, a gas introduction port 22 for introducing a gas into the processing space S is inserted. A sputter-gas, for example, an inert gas, is introduced into the processing space S from the gas introduction port 22 and a gas supply (not illustrated).

A loading/unloading port 23 is formed in the side wall of the processing chamber 10 to load/unload a substrate W. The loading/unloading port 23 is opened and closed by a gate valve 24. The processing chamber 10 is provided adjacent to a transport chamber 50, and the processing chamber 10 and the transport chamber 50 communicate with each other by opening the gate valve 24. The inside of the transport chamber 50 is maintained at a predetermined degree of vacuum, and a transport device (not illustrated) configured to load/unload a substrate W into/out of the processing chamber 10 is provided in the transport chamber 50.

The sputter-particle blocking plate 18 is configured as a substantially plate-like member, and is horizontally disposed at an intermediate position in the height direction of the processing space S. The edge of the sputter-particle blocking plate 18 is fixed to the side wall of the chamber body 10a. The sputter-particle blocking plate 18 divides the processing space S into a first space S1 and a second space S2. The first space S1 is a space above the sputter-particle blocking plate 18, and the second space S2 is a space below the sputter-particle blocking plate 18.

The sputter-particle blocking plate 18 has a slit-like passage hole 19 formed to pass sputter-particles therethrough. The passage hole 19 penetrates the sputter-particle blocking plate 18 in the thickness direction (Z direction) of the sputter-particle blocking plate 18. The passage hole 19 is formed to be elongated in the Y direction, which is the horizontal direction in the drawing, that is, the longitudinal direction. The length in the Y direction of the passage hole 19 is formed longer than the diameter of the substrate W.

The first sputter-particle emitter 12a has a target holder 26a, a target 30a held by the target holder 26a, and a power supply 28a configured to apply a voltage to the target holder 26a. In addition, the second sputter-particle emitter 12b has a target holder 26b, a target 30b held by the target holder 26b, and a power supply 28b configured to apply a voltage to the target holder 26b.

The target holders 26a and 26b are made of a conductive material, and are disposed above the sputter-particle blocking plate 18 and at different positions on the inclined surface of the lid 10b of the processing chamber 10 via insulating members. In this example, the target holders 26a and 26b are provided at positions facing each other across the passage hole 19, but may be provided at arbitrary positions without being limited thereto. The target holders 26a and 26b may be provided at arbitrary positions. The target holders 26a and 26b hold the targets 30a and 30b such that the targets 30a and 30b are positioned obliquely above the passage hole 19. The targets 30a and 30b are made of a material containing a constituent element of a film to be formed, and may be a conductive material or a dielectric material.

The power supplies 28a and 28b are electrically connected to the target holders 26a and 26b, respectively. The power sources may be DC power sources when the targets 30a and 30b are conductive materials, and may be high frequency power sources when the targets 30a and 30b are dielectric materials. When the power supplies 28a and 28b are high-frequency power supplies, they are connected to the target holders 26a and 26b via a matching device. By applying a voltage to the target holders 26a and 26b, the sputter-gas is dissociated around the targets 30a and 30b. Then, ions in the dissociated sputter-gas collide with the targets 30a and 30b, and sputter-particles, which are particles of the constituent material of the targets, are emitted from the targets 30a and 30b.

As described above, in the first and second sputter-particle emitters 12a and 12b, since the target holders 26a and 26b are provided at mutually different positions (positions facing each other in this example), the sputter-particles are emitted from the targets 30a and 30b held by the target holders 26a and 26b in different oblique directions (opposite directions in this example). Then, among the emitted sputter-particles, the sputter-particles that have passed through the passage hole 19 are obliquely incident on the substrate W to be deposited thereon.

The arrangement position and orientation of the targets 30a and 30b by the target holders 26a and 26b are arbitrary, and are set depending on the pattern formed on the substrate W.

Figure 3:
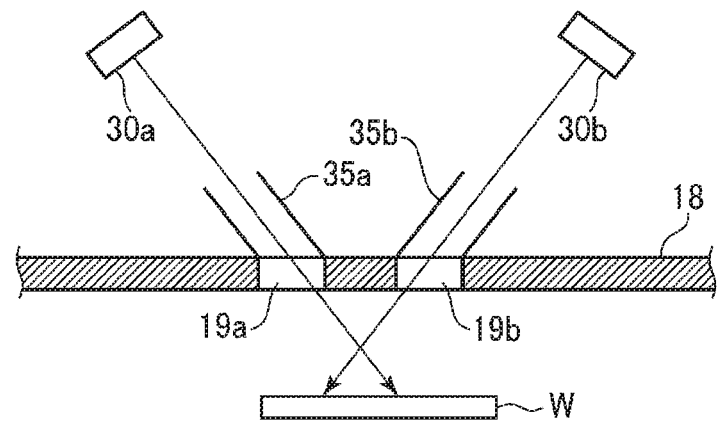
FIG. 3 is a cross-sectional view illustrating another example of a sputter-particle blocking plate.

Although all the sputter-particles emitted from the targets 30a and 30b pass through the passage hole 19 in the present embodiment, the sputter-particles may pass through different passage holes, as illustrated in FIG. 3. That is, by providing sputter-particle blocking plate 18 with two passage holes 19a and 19b and providing fins 35a and 35b having a collimator function in the vicinity of the passage holes 19a and 19b, it is possible to make the sputter-particles emitted from targets 30a and 30b pass through each of the passage holes 19a and 19b.

The substrate support 14 is provided in the chamber body 10a of the processing chamber 10, and horizontally supports the substrate W via support pins 31. The substrate support 14 is configured to be movable linearly in the X direction, which is the horizontal direction, by the substrate moving mechanism 16. Accordingly, the substrate W supported by the substrate support 14 is linearly moved in the horizontal plane by the substrate moving mechanism 16. The substrate moving mechanism 16 has an articulated arm 32 and a driver 33, and is configured to move the substrate support 14 in the X direction by driving the articulated arm 32 with the driver 33.

The film-forming apparatus 1 further includes a controller 40. The controller 40 includes a computer, and controls respective components of the film-forming apparatus 1, such as the power supplies 28a and 28b, the exhaust device 20, the driver 33, and the like. The controller 40 has a main controller consisting of a CPU that actually performs control described herein, an input device, an output device, a display device, and a storage device. The storage device stores parameters of various processes to be executed by the film-forming apparatus 1, and includes a storage medium in which a program for controlling the processes to be executed by the film-forming apparatus 1, that is, a processing recipe, is stored. The main controller of the controller 40 calls a predetermined processing recipe stored in the storage medium, and causes the film-forming apparatus 1 to execute a predetermined process based on the processing recipe.

[Film-Forming Method]

Next, a film-forming method in the film-forming apparatus of the first embodiment configured as described above will be described.

First, after evacuating the processing space S in the processing chamber 10, a sputter-gas, for example, an inert gas, is introduced into the processing space S from the gas introduction port 22 to adjust a pressure of the processing space S to a predetermined pressure.

Next, the substrate support 14 is positioned at the substrate delivery position, the gate valve 24 is opened, and a substrate W is placed on the substrate support 14 (on the support pins 31) by the transport device (not illustrated) of the transport chamber 50. Next, the transport device is returned to the transport chamber 50 and the gate valve 24 is closed.

Next, sputter-particles are obliquely emitted from the targets 30a and 30b of the first and second sputter-particle emitters 12a and 12b, respectively, while moving the substrate W on the substrate support 14 in the X direction, which is one of the horizontal directions.

At this time, the emission of the sputter-particles is performed by applying a voltage to the target holders 26a and 26b from the power supplies 28a and 28b such that ions in the sputtered gas dissociated around the targets 30a and 30b collide with the targets 30a and 30b.

The sputter-particles obliquely emitted from the targets 30a and 30b of the first and second sputter-particle emitters 12a and 12b pass through the passage hole 19 formed in the sputter-particle blocking plate 18 and are obliquely incident on the substrate W to be deposited thereon.

When film formation is performed by causing sputter-particles to be emitted obliquely from the target of one sputter-particle emitter while the substrate is moved to be scanned as in the related art, applicable film formation modes are limited even though film formation with high directivity may be performed.

In contrast, in the present embodiment, sputter-particles are obliquely emitted from the targets 30a and 30b mounted on the two sputter-particle emitters 12a and 12b while the substrate W is moved to be scanned. This makes it possible to perform film formation in various film formation modes by simultaneously or alternately emitting sputter-particles from two targets, and adjusting parameters such as the directions of the targets, the number of passing holes, and the angle of the fins. Accordingly, it is possible to realize sputtering film formation with extremely high degree of freedom.

The details will be described below.

(1) First Example of Film-Forming Method in First Embodiment

In the first example, the film-forming apparatus 1 performs film formation by alternately using the first sputter-particle emitter 12a and the second sputter-particle emitter 12b.

FIGS. 4A to 4D are schematic views for explaining execution states of the method of this example.

Figure 4A:
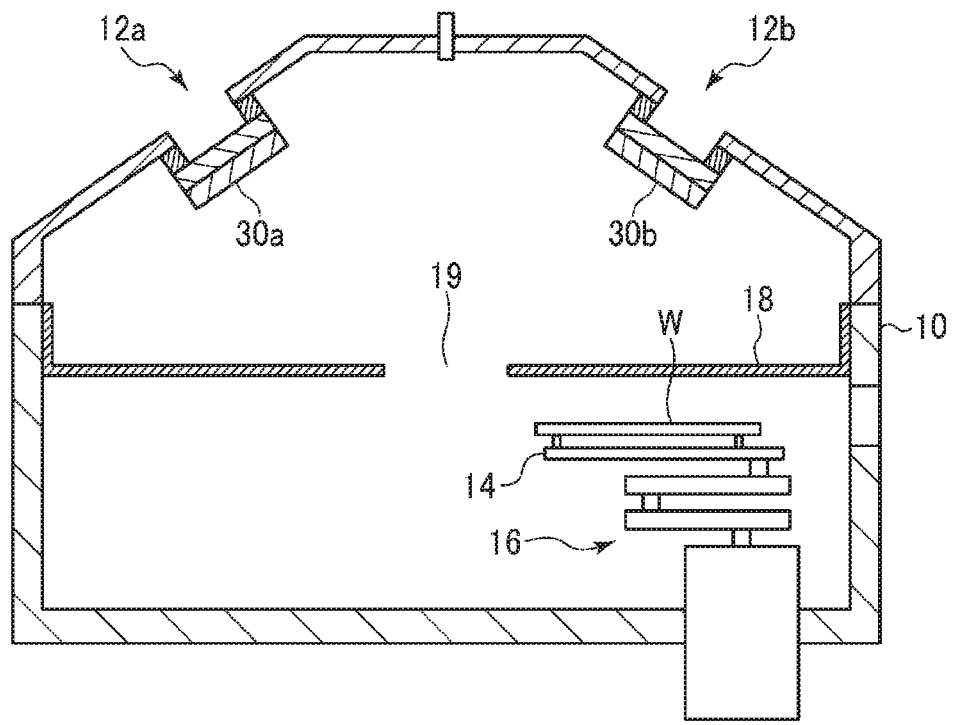
FIG. 4A is a schematic view for explaining an execution state of a first example of a film-forming method using a film-forming apparatus according to a first embodiment.
Figure 4B:
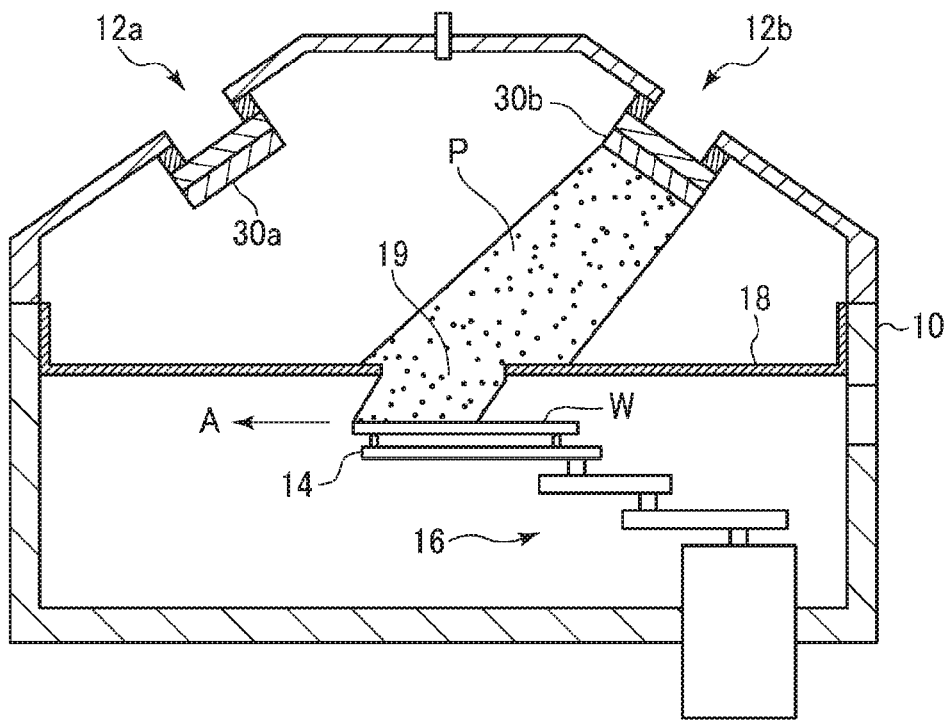
FIG. 4B is a schematic view for explaining an execution state of the first example of the film-forming method using the film-forming apparatus according to the first embodiment.

First, as illustrated in FIG. 4A, a substrate W is delivered to the substrate support 14 at a retracted position. Next, as illustrated in FIG. 4B, while moving the substrate W on the substrate support 14 in the direction A in the drawing along the X direction, sputter-particles P are obliquely emitted only from the target 30b of the second sputter-particle emitter 12b. As a result, the sputter-particles P are obliquely incident on the substrate W from one direction, and are deposited on the substrate (first film formation).

Figure 4C:
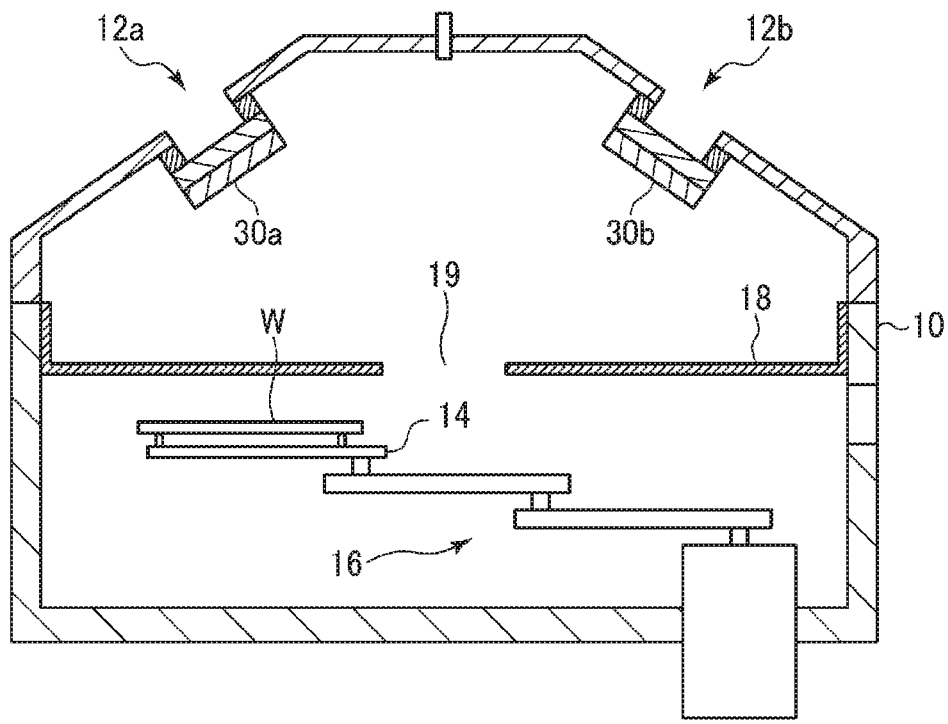
FIG. 4C is a schematic view for explaining an execution state of the first example of the film-forming method using the film-forming apparatus according to the first embodiment.

As illustrated in FIG. 4C, after the substrate W completely passes through the passage hole 19 in the sputter-particle blocking plate 18, the sputter-particles emitted from the target 30b by the second sputter-particle emitter 12b are stopped.

Figure 4D:
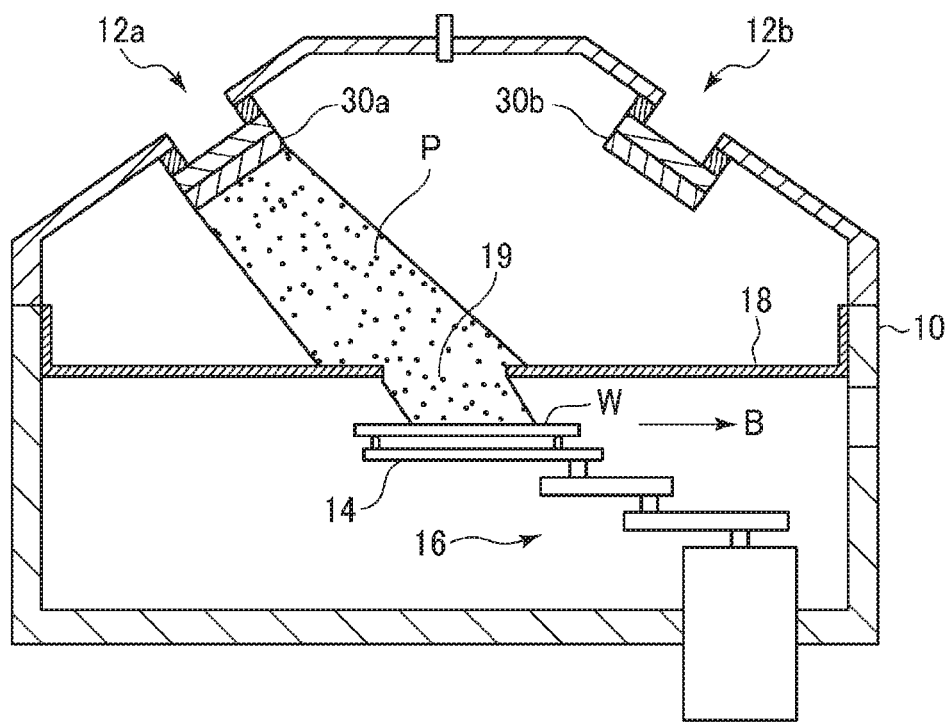
FIG. 4D is a schematic view for explaining an execution state of the first example of the film-forming method using the film-forming apparatus according to the first embodiment.

Next, as illustrated in FIG. 4D, while moving the substrate W on the substrate support 14 in the direction B, which is opposite the direction A, sputter-particles P are obliquely emitted only from the target 30a of the first sputter-particle emitter 12a. As a result, the sputter-particles P are obliquely incident on the substrate W from a direction opposite the previous direction, and are deposited on the substrate (second film formation).

The first film formation and the second film formation described above are alternately repeated once or more.

Figure 5:
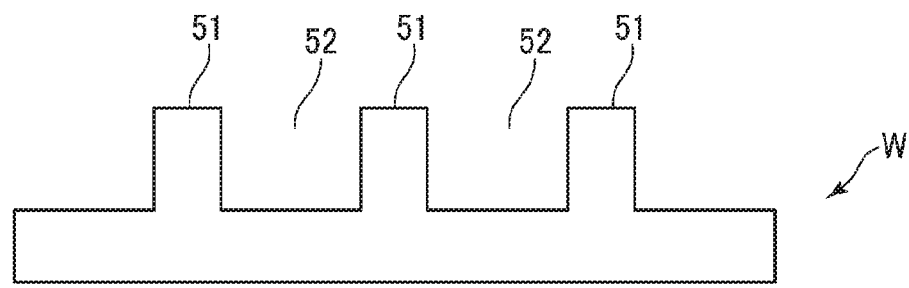
FIG. 5 is a cross-sectional view illustrating a substrate having a trench pattern applicable to a film-forming method.

This film-forming method is suitable for forming a film selectively and substantially vertically on convex portions 51 with respect to the substrate W having a trench pattern in which the convex portions 51 and concave portions (trenches) 52 are alternately formed as illustrated in FIG. 5.

Figure 6A:
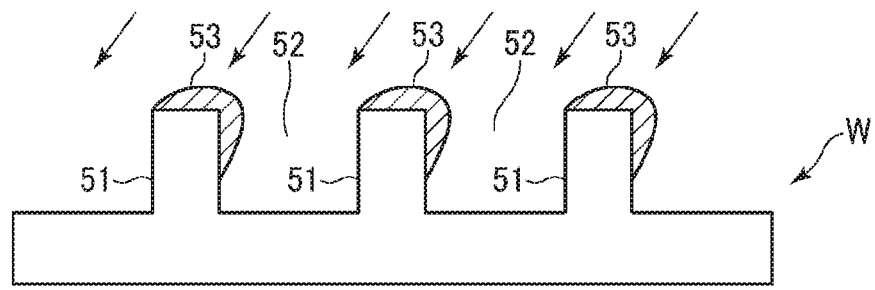
FIG. 6A is a cross-sectional view illustrating a state when first film formation is performed on the substrate having the trench pattern of FIG. 5 according to the first embodiment of the film-forming method.

When the first film formation using the second sputter-particle emitter 12b is performed on the substrate having the pattern of FIG. 5, a first film 53 overhanging on the right sides of the convex portions 51 is formed, as illustrated in FIG. 6A. However, if the sputter-particles are continuously emitted from the second sputter-particle emitter 12b and the film formation continues, the overhang becomes severe and film growth in the vertical direction is difficult.

Figure 6B:
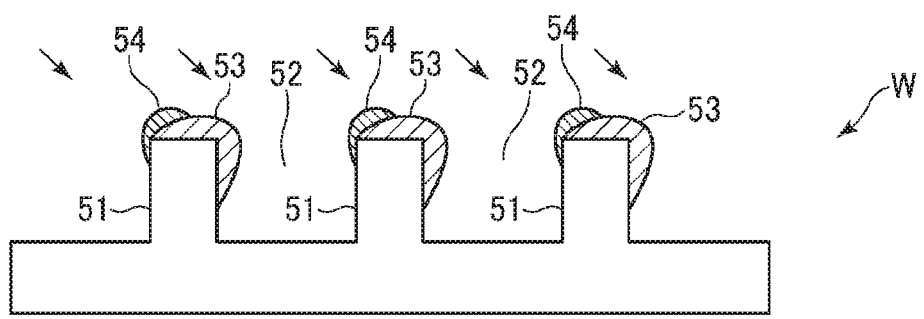
FIG. 6B is a cross-sectional view illustrating a state when second film formation performed on the substrate in the state of FIG. 6A after the first film formation.

In contrast, after the first film formation is performed, the second film formation is performed using the first sputter-particle emitter 12a, whereby the second film 54 overhanging on the left sides of the convex portions 51 is formed and a base for film growth in the vertical direction is formed, as illustrated in FIG. 6B. This enables further film formation in the vertical direction.

Figure 6C:
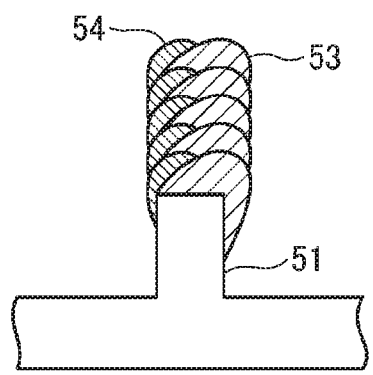
FIG. 6C is a cross-sectional view illustrating a state in which the film is vertically grown by repeating the first film formation and the second film formation according to the first embodiment of the film-forming method.

As described above, by alternately repeating the first film formation and the second film formation while utilizing the overhang properly, it is possible to grow the film in a substantially vertical direction, as illustrated in FIG. 6C. If the film is crystalline, it is possible to make crystal growth in a substantially vertical direction.

Figure 7:
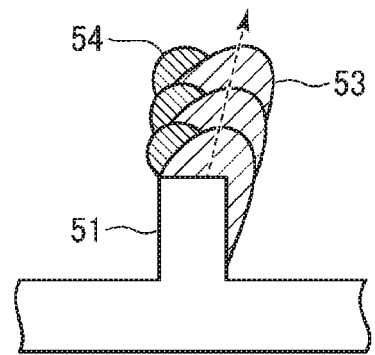
FIG. 7 is a cross-sectional view illustrating a film growth state, when the output in the first film formation is larger than the output in the second film formation and repeating the first film formation and the second film formation according to the first embodiment of the film-forming method.

At this time, it is possible to change the direction of film growth (crystal growth) by changing the output of the second sputter-particle emitter 12b in the first film formation and the output of the first sputter-particle emitter 12a in the second film formation. For example, by setting the second sputter-particle emitter 12b to have a higher output than that of the first sputter-particle emitter 12a, the first film 53 is grown more than the second film, and it is possible to make a slight oblique film growth (crystal growth) rightward from the convex portions 51 in the drawing, as illustrated in FIG. 7. It is possible to obtain the same effect by varying the moving speed (scanning speed) of the substrate W between the time of forming the first film 53 and the time of forming the second film 54.

Figure 8:
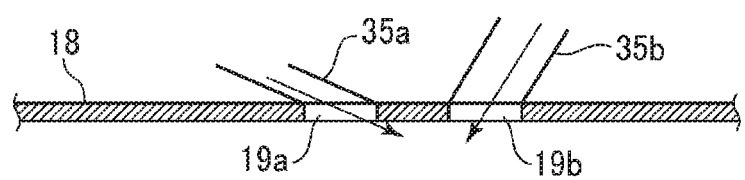
FIG. 8 is a cross-sectional view illustrating a shielding plate having two passage holes and two fins provided in the vicinity of the passage holes and having different angles.

Further, as illustrated in FIG. 8, the alternate film formation described above may be performed using a sputter-particle blocking plate 18 having two passage holes 19a and 19b and fins 35a and 35b formed in the vicinity of the passage holes and having different angles. In this case, the sputter-particles emitted from the target 306 of the second sputter-particle emitter 12b pass through the passage hole 19b, and the sputter-particles emitted from the first sputter-particle emitter 12a pass through the passage hole 19a. This makes it possible to make the angle of the sputter-particles emitted from the first sputter-particle emitter 12a and incident on the substrate W different from the angle of the sputter-particles emitted from the second sputter-particle emitter 12b and incident on the substrate W. FIG. 8 illustrates an example in which the angle of the fin 35b is made higher than that of the fin 35a. This makes it possible to control the crystal growth direction of the first film formation and the second film formation.

Figure 9:
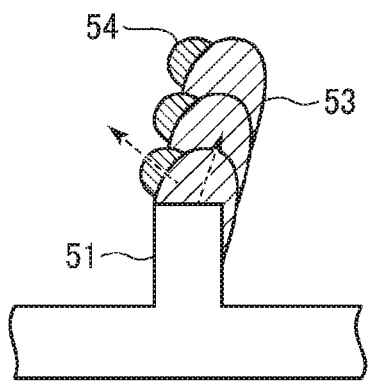
FIG. 9 is a cross-sectional view illustrating a state in which a film is formed by repeating the first film formation and the second film formation using the shielding plate of FIG. 8.

Specifically, as illustrated in FIG. 9, during the first film formation, the sputter-particles are emitted to the substrate W in the high angular direction and the first film 53 grows in the high angular direction, and during the second film formation, the sputter-particles are emitted to the substrate in the low angular direction and the second film 54 grows in the low angular direction. Even if the angles of the targets 30a and 30b are set differently, it is possible to obtain the same effect.

Figure 10A:
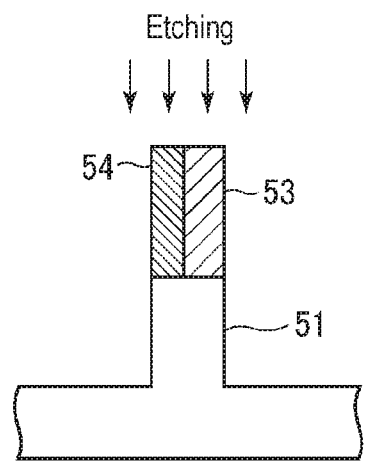
FIG. 10A is a cross-sectional view schematically illustrating a case in which two targets are formed of materials having different etching selectivity and a layered structure which is the same as that of FIG. 6C which is formed of different materials.
Figure 10B:
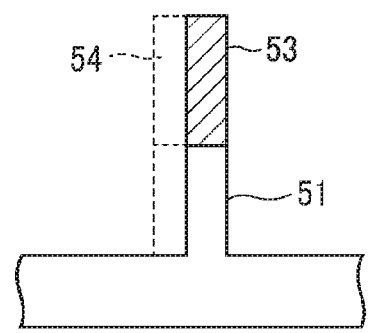
FIG. 10B is a cross-sectional view illustrating a state in which etching is performed on the structure of FIG. 10A using a film of one material, which is not easily etched, as a mask, so that the film of the other material and a part of a convex portion are etched.

In addition, in the case of the alternate film formation as in this example, the targets 30a and 30b may be made of different materials, and when repeating the first film formation and the second film formation, the materials of the first film 53 and the second film 54 may be different from each other. For example, it is possible to perform selective etching by making etching selectivity different between the first film 53 and the second film 54. Specifically, in the layered structure of the first film 53 and the second film 54 as in FIG. 6C, the material of the second film 54 may be more easily etched than that of the first film 53 under a predetermined etching condition. As schematically illustrated in FIG. 10A, when etching is performed on the layered structure similar to that of FIG. 6C under the above-described predetermined etching condition, the second film 54 is selectively etched as in FIG. 10B. Therefore, the first film 53, which is difficult to etch, becomes a mask, and the portion, which was the base of the second film 54 of the convex portion 51, is etched. When the first film 53 is made of a wiring material, it is possible to relatively easily form a wiring line having a width smaller than the width of the convex portion 51.

(2) Second Example of Film-Forming Method in First Embodiment

In the second example, the film formation is performed by the film-forming apparatus 1 simultaneously using the first sputter-particle emitter 12a and the second sputter-particle emitter 12b.

Figure 11:
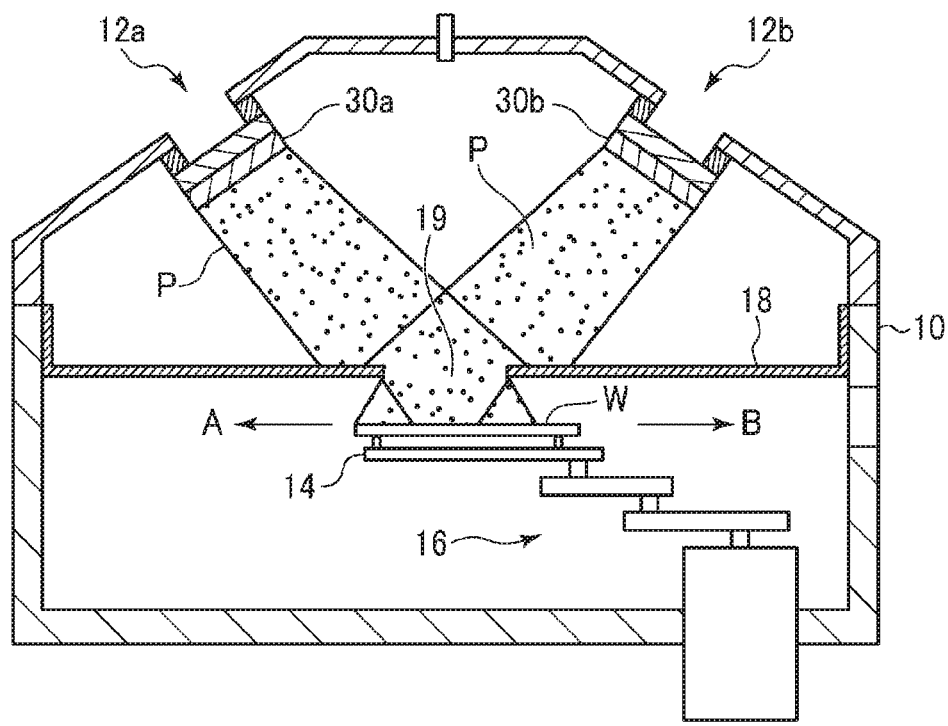
FIG. 11 is a schematic view for explaining an execution state of a second example of the film-forming method using the film-forming apparatus according to an embodiment.

Specifically, as illustrated in FIG. 11, while moving the substrate W on the substrate support 14 in a direction A or a direction B, which is parallel to the X direction, sputter-particles P are obliquely emitted from the target 30a of the first sputter-particle emitter 12a and the target 30b of the second sputter-particle emitter 12b. As a result, the sputter-particles P are obliquely incident on the substrate W from opposite directions, and are deposited on the substrate W. The film formation may be terminated while the substrate W is moved to be scanned one time in the direction A or the direction B. In addition, the film formation may be performed by emitting the sputter-particles from the targets 30a and 30b while the substrate W is alternately moved to be scanned in the direction A and the direction B.

Figure 12:
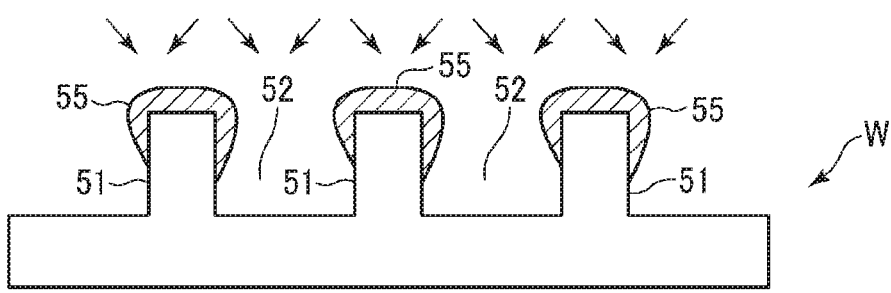
FIG. 12 is a cross-sectional view illustrating a state in which a film is formed on a substrate having the trench pattern of FIG. 5 according to a second embodiment of the film-forming method.

As described above, by emitting sputter-particles from different directions to the substrate W, it is possible to form a film 55 overhanging on the opposite sides of the upper portions of the convex portions 51 of a trench pattern, as illustrated in FIG. 12 through a single film formation.

At this time, by using the sputter-particle blocking plate 18 provided with two passage holes 19a and 19b and fins 35a and 35b in the vicinity of the passage holes 19a and 19b, as illustrated in FIG. 3, it is also possible to easily adjust the incident angle of sputter-particles. That is, by adjusting the angles of the fins 35a and 35b, it is possible to adjust the incident angle of the sputter-particles to adjust the shape or the like of the film 55 formed on the upper portions of the concave portions 52.

In addition, by changing the arrangement and angles of the two targets, it is possible to variously change the planar angle and incident angle of sputter-particles with respect to the substrate W and thus it is possible to form various films depending the pattern formed on the substrate W.

Figure 13A:
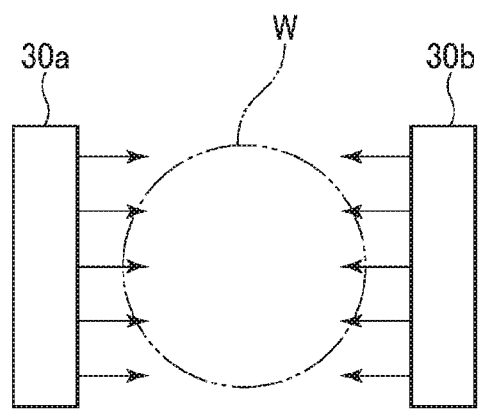
FIG. 13A is a view illustrating an example of arrangement of two targets.
Figure 13B:
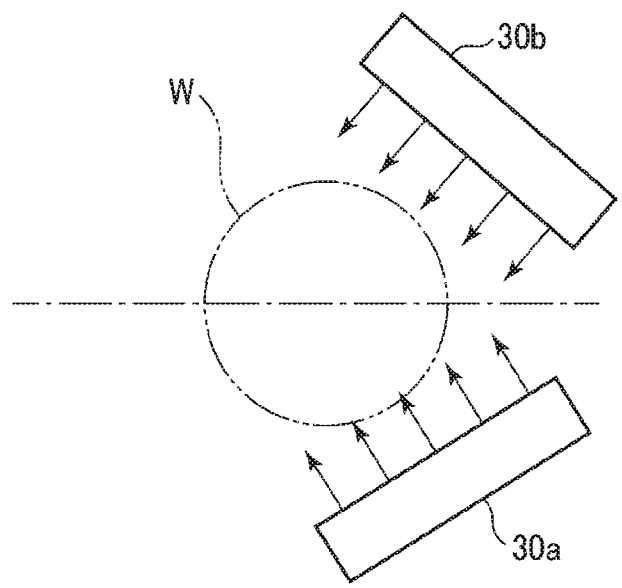
FIG. 13B is a view showing another example of arrangement of two targets.

For example, as illustrated in FIG. 13A, by arranging two targets 30a and 30b to be perpendicular to the direction, in which the substrate is moved to be scanned, of the substrate W and to be parallel to each other, it is possible to perform film formation as in FIG. 12. Further, as illustrated in FIG. 13B, by arranging the two targets 30a and 30b diagonally and symmetrically with respect to a line parallel to the direction, in which the substrate is moved to be scanned, of the substrate W, it is possible to perform film formation by emitting the sputter-particles to the substrate W from two directions on one side of the moving direction of the substrate.

As described above, it is possible to control film formation by adjusting the incident angle using the fins disposed in the vicinity of the passage holes and appropriately adjusting the arrangement and angles of the targets. That is, it is possible to arbitrarily control the position at which the film is formed, the shape of the film, and the like with respect to various patterns of the substrate W.

Second Embodiment

Next, a second embodiment will be described.

Figure 14:
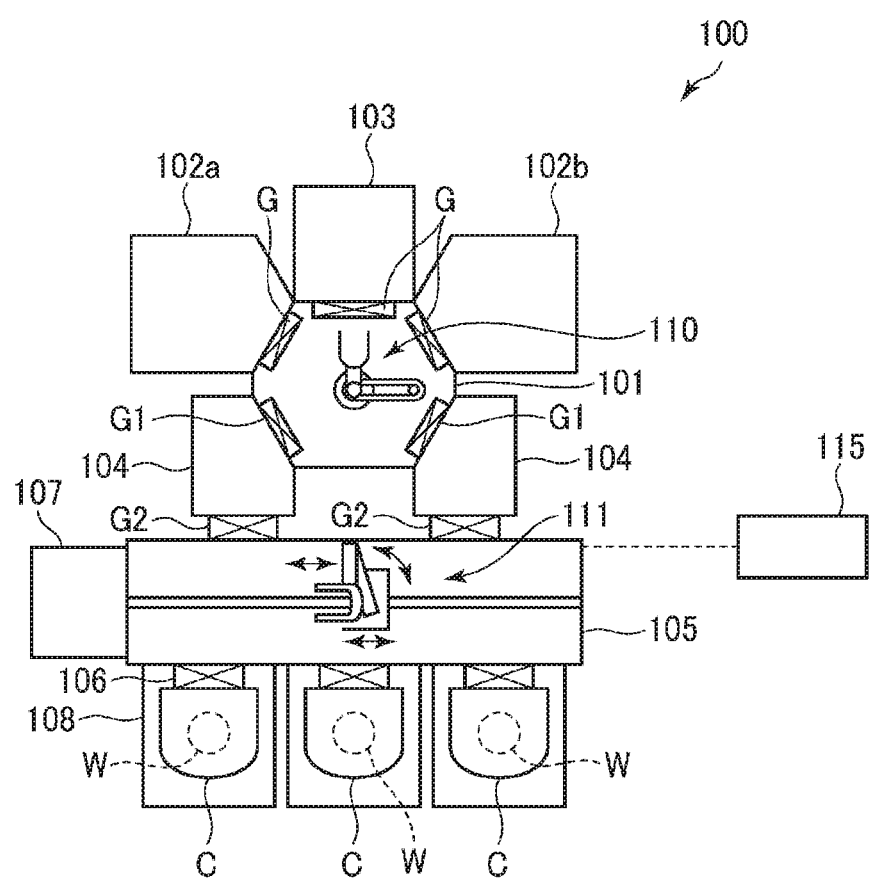
FIG. 14 is a schematic configuration view illustrating an example of a film-forming system according to a second embodiment.
Figure 15:
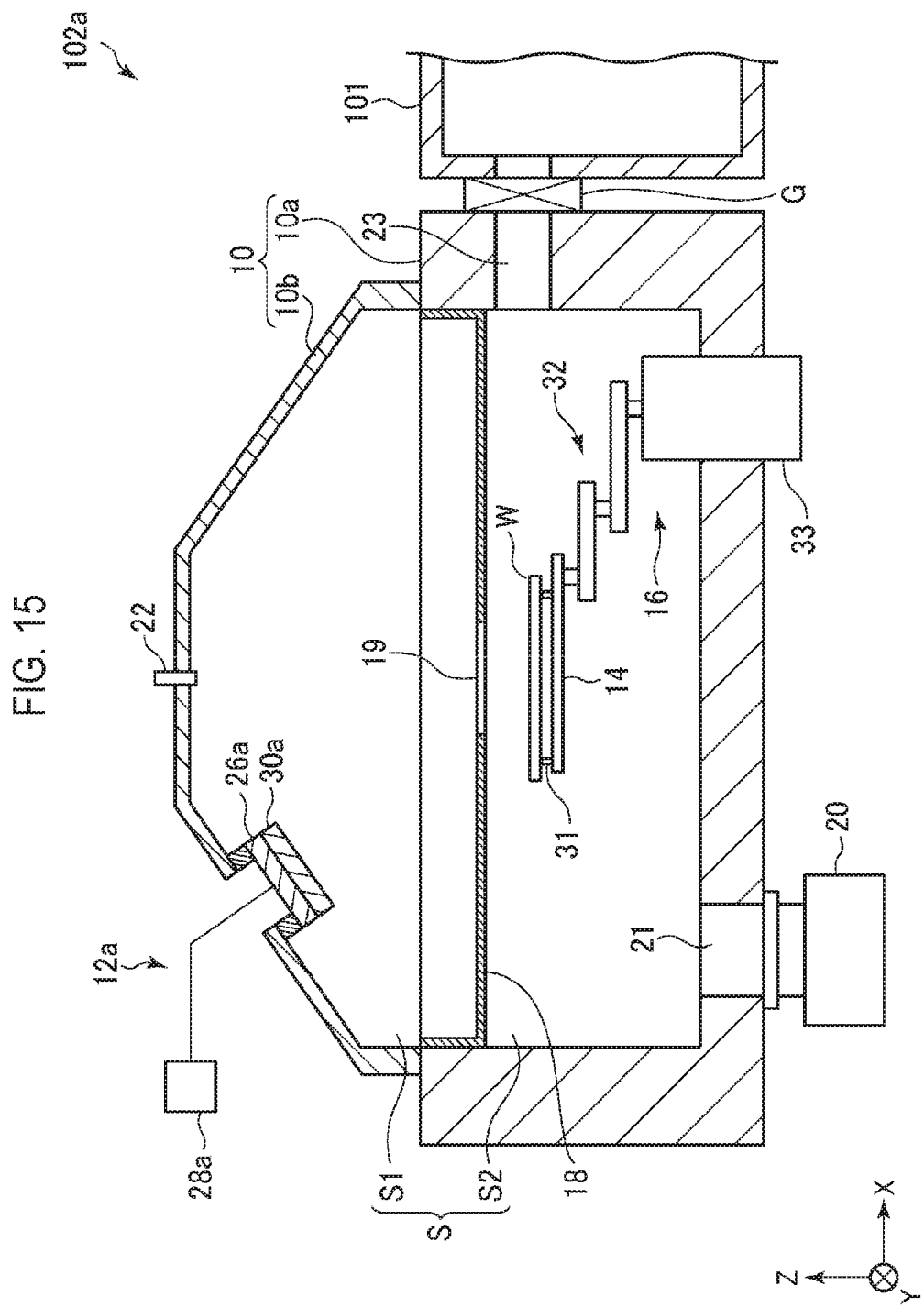
FIG. 15 is a cross-sectional view illustrating a first film-forming apparatus of the film-forming system of FIG. 14.

FIG. 14 is a schematic configuration view illustrating an example of a film-forming system according to the second embodiment, and FIG. 15 is a cross-sectional view illustrating a first film-forming apparatus of the film-forming system.

The film-forming system 100 has a polygonal vacuum transport chamber 101. A first film-forming apparatus 102a and a second film-forming apparatus 102b are connected to the vacuum transport chamber 101 via the gate valves G to be opposite to each other, and a substrate rotation chamber 103 is connected between the first and second film-forming apparatuses 102a and 102b. In addition, two load-lock chambers 104 are connected to the side of the vacuum transport chamber 101 opposite the substrate rotation chamber 103 via gate valves G1. An atmospheric transport chamber 105 is provided on the side opposite the two load-lock chambers 104 with the vacuum transport chamber 101 interposed therebetween. The two load-lock chambers 104 are connected to the atmosphere transport chamber 105 via gate valves G2. The load-lock chambers 104 perform pressure control between atmospheric pressure and vacuum when the substrate W is transported between the atmosphere transport chamber 105 and the vacuum transport chamber 101.

In the wall of the atmosphere transport chamber 105 opposite the wall of the atmosphere transport chamber 105 on which the load-lock chambers 104 are mounted, three carrier-mounting ports 106 are provided to install therein a carrier (a FOUP or the like) C for accommodating a substrate W. In addition, on the side wall of the atmosphere transport chamber 105, an alignment chamber 107 is provided to perform alignment by rotating a substrate W. In the atmosphere transport chamber 105, a downflow of clean air is formed. Reference numeral 108 denotes stages of carriers C.

In the vacuum transport chamber 101, a first substrate transport mechanism 110 is provided. The vacuum transport chamber 101 and the first substrate transport mechanism 110 constitute a substrate transporter. The first substrate transport mechanism 110 transports a substrate W to the first film-forming apparatus 102a, the second film-forming apparatus 102b, the substrate rotation chamber 103, and the load-lock chambers 104.

In the atmosphere transport chamber 105, a second substrate transport mechanism 111 is provided. The second substrate transport mechanism 111 transports a wafer W to the carrier C, the load-lock chambers 104, and the alignment chamber 107.

As illustrated in FIG. 15, the first film-forming apparatus 102a is configured to be the same as the film-forming apparatus 1 of the first embodiment, except that only the sputter-particle emitter 12a is provided as a sputter-particle emitter and the sputter-particle emitter 12b is not provided. The second film-forming apparatus 102b also has the same configuration.

The substrate rotation chamber 103 functions as a substrate rotation mechanism that rotates the substrate W in a horizontal plane to change the orientation of the substrate, and has the same configuration as the alignment chamber 107.

The film-forming system 100 has an overall controller 115 composed of a computer. The overall controller 115 includes a main controller (CPU) that controls the first and second film-forming apparatuses 102a and 102b, the substrate rotation chamber 103, the load-lock chambers 104, the vacuum transport chamber 101, the first and second substrate transport mechanisms 110 and 111, a drive system of the gate valves G, G1, and G2, and the like. In addition, the overall controller 115 includes an input device, an output device, a display device, and a storage device (a storage medium). The main controller of the overall controller 115 controls the film-forming system 100 to execute a predetermined operation based on, for example, a processing recipe stored in the storage medium of the storage device.

In the film-forming system 100 configured as described above, sputter film formation is performed on opposite sides of a convex portion using the first and second film-forming apparatuses 102a and 102b.

First, a substrate W is taken out from a carrier C by the second transport mechanism 111, and after passing through the alignment chamber 107, the substrate W is loaded into one of the load-lock chambers 104. Then, the inside of the load-lock chamber 104 is evacuated. Then, the substrate W in the load-lock chamber 104 is loaded into the chamber of the first film-forming apparatus 102a by the first transport mechanism 110.

In the first film-forming apparatus 102a, sputter-particles are obliquely emitted from the target 30a of the first sputter-particle emitter 12a while moving the substrate W on the substrate support 14 in one horizontal direction in the chamber. Thus, the sputter-particles are obliquely incident on the substrate W from the one direction, and a first film 53 is formed on one side of convex portions 51 of the substrate W as illustrated in FIG. 6A described above.

Next, the substrate W is unloaded from the chamber of the first film-forming apparatus 102a by the first transport mechanism 110, is transported to the substrate rotation chamber 103, and is rotated by, for example, 180°.

Next, after being rotated, the substrate W is loaded into the chamber of the second film-forming apparatus 102b by the first transport mechanism 110.

Similarly, in the first film-forming apparatus 102h, sputter-particles are obliquely emitted from the target 30a of the first sputter-particle emitter 12a while moving the substrate W on the substrate support 14 in one horizontal direction in the chamber. As a result, the sputter-particles are obliquely incident on the substrate W from the one direction. At this time, since the substrate W is rotated by 180° (inverted), as illustrated in FIG. 6B described above, a second film 54 is formed on the sides opposite the first film 53 of the convex portions 51.

By alternately repeating the film formation by the first film-forming apparatus 102a and the film formation by the second film-forming apparatus 102b as described above, it is possible to grow a film in a substantially vertical direction as illustrated in FIG. 6C.

As described above, in the present embodiment, the film-forming system includes a plurality of processing apparatuses obliquely sputtering a substrate in at least one direction in a chamber, a transport mechanism that transports a substrate between the chambers of the processing apparatuses, and a substrate rotation mechanism that rotates a substrate in a plane. With this configuration, it is possible to sputter one side of a convex portion of a trench pattern using one film-forming apparatus and sputter the other side of the convex portion using another film-forming apparatus. This makes it possible to implement alternate sputtering on a convex portion of a trench pattern.

The rotation of the substrate W is not necessarily performed by providing the substrate rotation chamber 103 in the vacuum transport chamber 101. A substrate rotation mechanism may be provided in the chamber of any film-forming apparatus, or the substrate W may be rotated outside a vacuum system, for example, by the alignment chamber 107.

In addition, the rotation angle of the substrate W by the substrate rotation chamber 103 or the like may be set to any angle without being limited to 180°. This makes it possible to make an arbitrary location of a pattern convex portion formed on the substrate W face the target of the film-forming apparatus, so that it is possible to easily adjust the sputtered location and to enhance the degree of freedom in the uniform deposition property of a film. For this reason, compared with the case in which a plurality of targets, the installation angles of which are adjusted, are fixedly arranged, the adjustment range is wider, and it is also advantageous in terms of footprint and cost.

Figure 16A:
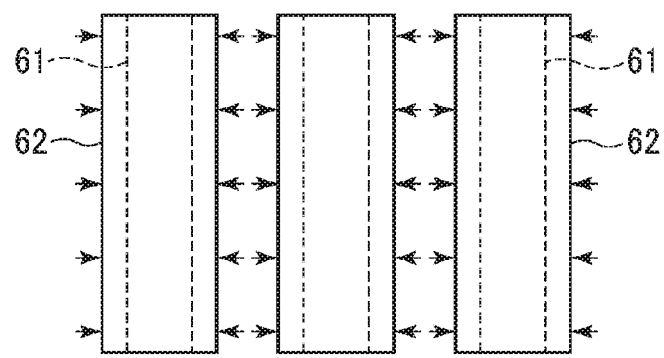
FIG. 16A is a view illustrating an example in which a film is formed while changing the rotation angle of a substrate according to the second embodiment.
Figure 16B:
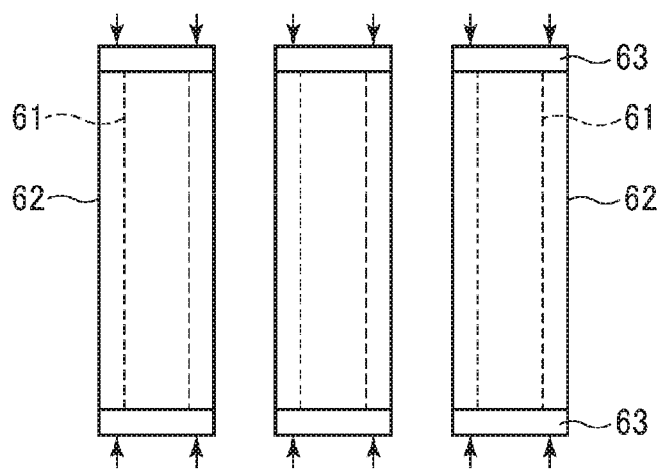
FIG. 16B is a view illustrating an example in which a film is formed while changing the rotation angle of a substrate according to the second embodiment.

For example, film formation illustrated in FIGS. 16A and 16B is possible. First, as illustrated in FIG. 16A, alternate film formation is performed in a direction perpendicular to the convex portions 61 of a trench pattern in the plan view while rotating the substrate W by 180°, thereby forming a film 62 on the long sides of the convex portions. Next, as illustrated in FIG. 16B, the substrate is rotated by 90° in the substrate rotation chamber 103, and then alternate film formation is performed in a direction parallel to the convex portions 61 of the trench pattern in the plan view while rotating the substrate W by 180°, thereby forming a film 63 on the short sides of the convex portions. In this manner, it is possible to form a film on all surfaces of the convex portions 61.

In the above example, after a film is formed on one side of each of the convex portions by the first film-forming apparatus 102a, the substrate is rotated in the substrate rotation chamber 103, and then a film is formed on the other side of each of the convex portions in the second film-forming apparatus 102b. However, in the present embodiment, the number of film-forming apparatuses may be one. For example, only the first film-forming apparatus 102a may be provided as a film-forming apparatus. In this case, a film may be formed on one side of each of the convex portions by the first film-forming apparatus 102a, the substrate may then be rotated in the substrate rotation chamber 103, and then a film may be formed on the other side of each of the convex portions by the first film-forming apparatus 102a.

Third Embodiment

Next, a third embodiment will be described.

Figure 17:
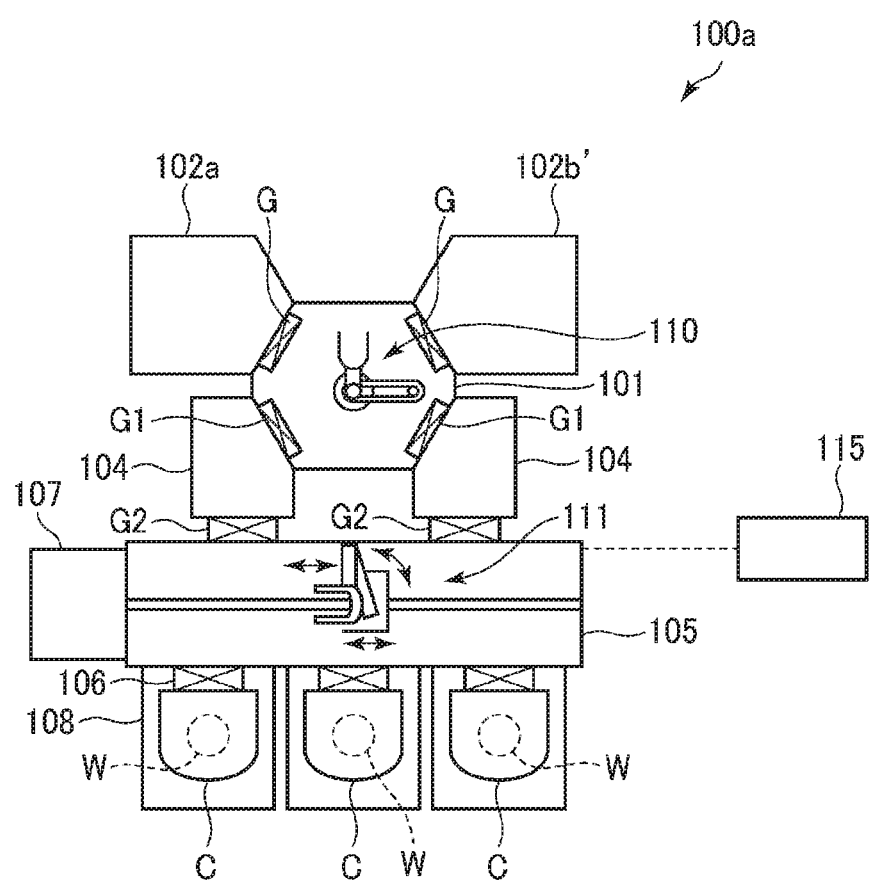
FIG. 17 is a schematic configuration view illustrating an example of a film-forming system according to a third embodiment.
Figure 18:
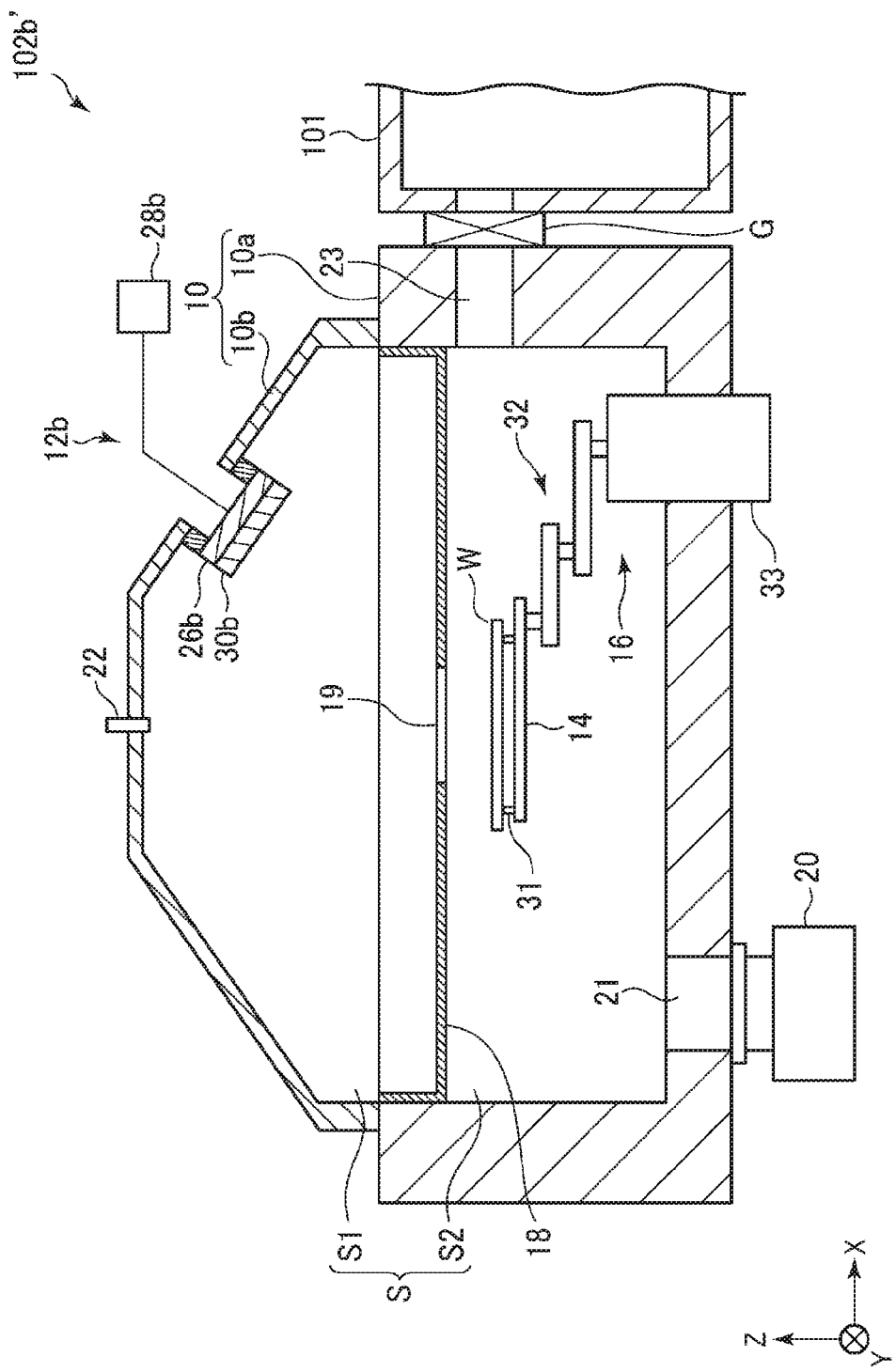
FIG. 18 is a cross-sectional view illustrating a second film-forming apparatus of the film-forming system of FIG. 17.

FIG. 17 is a schematic configuration view illustrating an example of a film-forming system according to the third embodiment, and FIG. 18 is a cross-sectional view illustrating a second film-forming apparatus of the film-forming system.

This film-forming system 100a is basically the same as the film-forming system 100 used in the second embodiment illustrated in FIG. 14, but differs from the second embodiment in that the substrate rotation chamber 103 is not present and in that the film-forming system 100a includes a second film-forming apparatus 102b' different from that in the second embodiment.

As illustrated in FIG. 18, the second film-forming apparatus 102b' is configured to be the same as the film-forming apparatus 1 of the first embodiment, except that only the sputter-particle emitter 12b is provided as a sputter-particle emitter and the sputter-particle emitter 12a is not provided. That is, in the second film-forming apparatus 102b', sputter-particles are emitted from the sputter-particle emitter on the side opposite to that of the first film-forming apparatus 102a.

As described above, by providing a plurality of film-forming apparatuses in which the arrangements of sputter-particle emitters in the chambers are opposite to each other in a mixed manner and causing a substrate to be transported therebetween, it is possible to implement alternate sputtering on the convex portions of the trench pattern without rotating the substrate. This may contribute to simplification of the configuration of a film-forming system, a small footprint, and cost reduction.

As suitable examples, the following examples may be mentioned. In the first film-forming apparatus 102a in which a target (a sputter-particle emitter) is disposed on the side opposite the substrate loading/unloading port (the gate valve G), the substrate W is moved to be scanned from the loading/unloading port side to the target side. Meanwhile, in the second film-forming apparatus 102b' in which a target (a sputter-particle emitter) is disposed on the loading/unloading port (a gate valve G) side, the substrate is moved to be scanned from the target side to the loading/unloading port side. By alternately performing these movements, it is possible to suitably perform alternate film formation on the convex portions of a trench pattern without using the substrate rotation chamber. That is, in the first film-forming apparatus 102a and the second film-forming apparatus 102b', it is preferable that the direction in which the substrate is moved to be scanned of the substrate W be opposite each other respect to the loading/unloading ports thereof.

Fourth Embodiment

Next, a fourth embodiment will be described.

Figure 19:
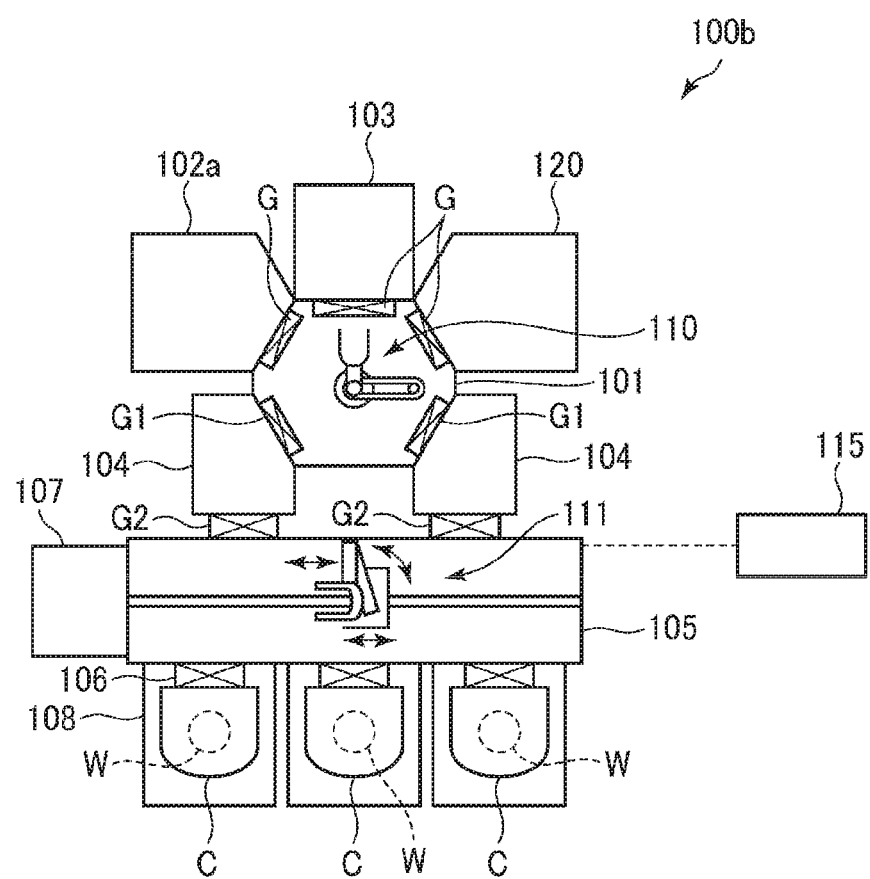
FIG. 19 is a schematic configuration view illustrating an example of a film-forming system according to a fourth embodiment.

FIG. 19 is a schematic configuration view illustrating an example of a film-forming system used in a fourth embodiment.

This film-forming system 100b is basically the same as the film-forming system 100 used in the second embodiment illustrated in FIG. 14. However, the film-forming system 100b differs from the film-forming system 100 in that a processing apparatus 120 that performs a process other than sputtering film formation is provided instead of the second film-forming apparatus 102b.

Examples of the processing apparatus 120 include a heating apparatus, a cooling apparatus, an etching apparatus or the like.

As described above, even when only the first film-forming apparatus 102a is used as the film-forming apparatus, after a film is formed on one side of each of the convex portions, by rotating the substrate W in the substrate rotation chamber 103 and loading the substrate W into the first film-forming apparatus 102a again, it is possible to form a film on the other sides of the convex portions. In addition, by providing the processing apparatus 120, processes other than sputtering film formation such as heating, cooling, and etching may be appropriately performed as needed before, during, and after the sputtering process.

In the present embodiment, at least one film-forming apparatus and at least one processing apparatus may be provided, but a plurality of film-forming apparatuses and processing apparatuses may be provided. When a plurality of processing apparatuses is provided, processing apparatuses having different functions may be provided.

Fifth Embodiment

Next, a fifth embodiment will be described.

The film-forming system according to the present embodiment includes a plurality of film-forming apparatuses, a plurality of vacuum transport chambers (transporters) provided in series, and a substrate rotation chamber provided between the plurality of vacuum transport chambers (a substrate rotation mechanism), and transports substrates serially.

Figure 20:
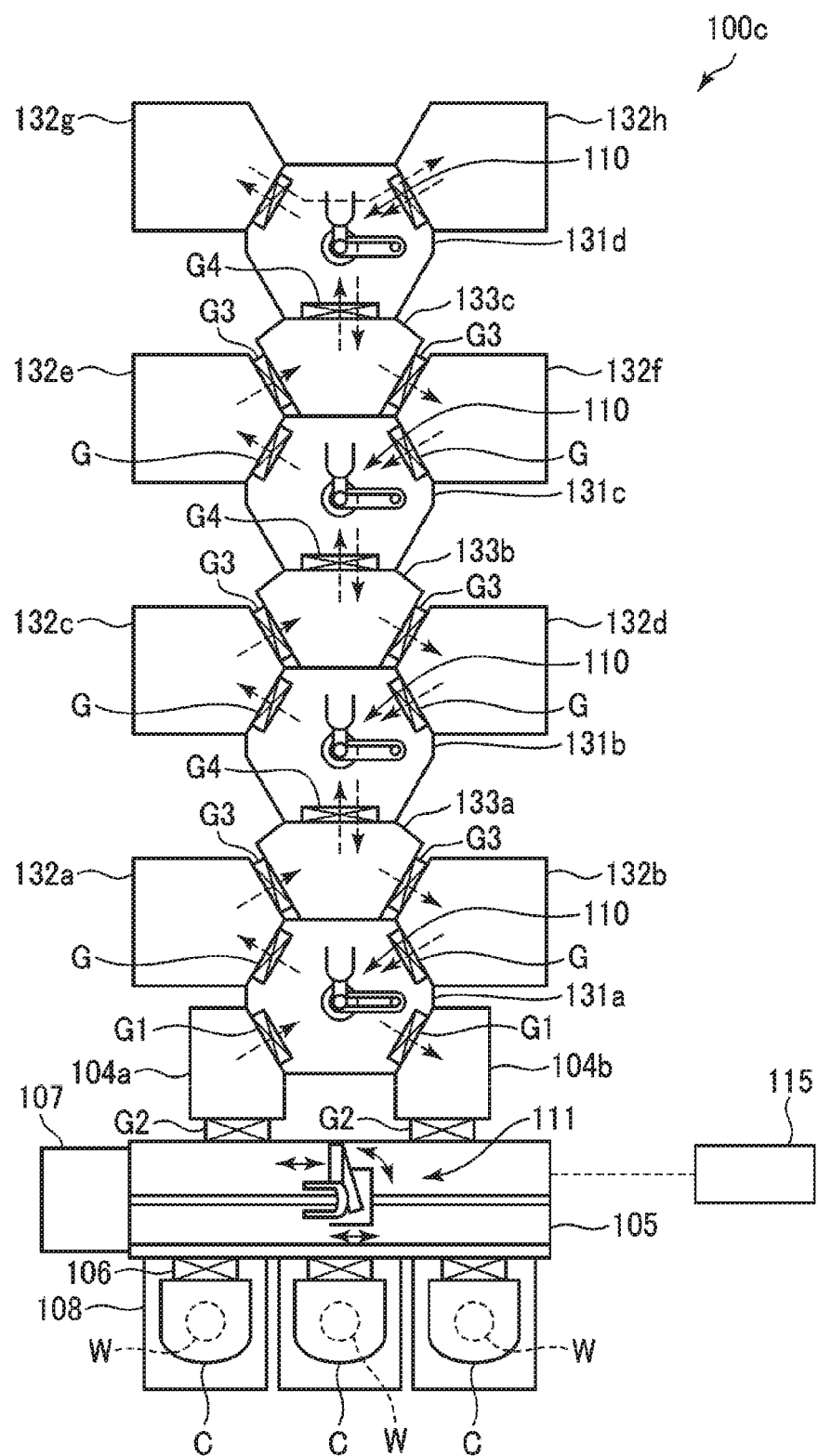
FIG. 20 is a schematic configuration view illustrating an example of a film-forming system according to a fifth embodiment.

FIG. 20 is a schematic configuration view illustrating an example of a film-forming system used in the fifth embodiment.

Similar to the film-forming system 100 according to the second embodiment, the film-forming system 100c has an atmosphere transport chamber 105 to which three carriers C are attached and is provided with two load-lock chambers 104a and 104b and an alignment chamber 107. A second transport mechanism 111 is provided in the atmosphere transport chamber 105.

The load-lock chambers 104a and 104b are connected to the first vacuum transport chamber 131a via gate valves G1. To the first vacuum transport chamber 131a, a second vacuum transport chamber 131b, a third vacuum transport chamber 131c, and a fourth vacuum transport chamber 131d are serially connected via first to third substrate rotation chambers 133a, 133b, and 133c, respectively. Similar to the vacuum transport chamber 101 of the film-forming system 100, a first transport mechanism 110 is provided in each of the first to fourth vacuum transport chambers 131a to 131d.

Two film-forming apparatuses 132a and 132b are connected to opposite sides of the first vacuum transport chamber 131a via gate valves G. In addition, the first substrate rotation chamber 133a is connected to the film-forming apparatuses 132a and 132b through gate valves G3, and is connected to the second vacuum transport chamber 131b through a gate valve G4.

Two film-forming apparatuses 132e and 132f are connected to opposite sides of the second vacuum transport chamber 131b via gate valves G. In addition, the second substrate rotation chamber 133b is connected to the film-forming apparatuses 132a and 132d through gate valves G3, and is connected to the third vacuum transport chamber 131c through a gate valve G4.

Two film-forming apparatuses 132e and 132f are connected to opposite sides of the third vacuum transport chamber 131c via gate valves G. In addition, the third substrate rotation chamber 133c is connected to the film-forming apparatuses 132e and 132f through gate valves G3, and is connected to the fourth vacuum transport chamber 131d through a gate valve G4.

Two film-forming apparatuses 132g and 132h are connected to opposite sides of the fourth vacuum transport chamber 131d via gate valves G.

In addition, all of the film-forming apparatuses 132a to 132h have the same structure, and, for example, have the same structure as the first film-forming apparatus 102a of the second embodiment. Further, the transportation of a substrate W between the film-forming apparatuses and the substrate rotation chambers 133a to 133c may be performed by the first transport mechanisms 110, or a transport mechanism may be provided in each of the substrate rotation chambers 133a to 133c, and the transportation of a substrate may be performed using the transport mechanism. In addition, the film-forming system 100c has the overall controller 115, which is the same as that of the film-forming system 100.

In the film-forming system 100c configured as described above, first, a substrate W is taken out from a carrier C by the second transport mechanism 111, and after passing through the alignment chamber 107, the substrate W is loaded into the load-lock chambers 104a. Next, the inside of the load-lock chamber 104a is evacuated. Then, the substrate W in the load-lock chamber 104a is loaded into the chamber of the film-forming apparatus 132a by the first transport mechanism 110 of the first vacuum transport chamber 131a, and film formation on one side is performed. Thereafter, the substrate W is transported to the first substrate rotation chamber 133a, and the substrate W is rotated in a plane by the first substrate rotation chamber 133a. Thereafter, film formation on the opposite side is performed by the film-forming device 132c via the first transport mechanism 110 of the second vacuum transport chamber 131b.

In this manner, as indicated by the broken-line arrows in FIG. 20, the substrate W is serially transported to the plurality of film-forming apparatuses to repeat the film-forming process. When the film formation in the film-forming apparatus 132b is completed, the substrate W is transported to the load-lock chamber 104b by the first transport mechanism 110 of the first vacuum transport chamber 131a. Then, after the load-lock chamber 104b is returned to the atmospheric pressure, the wafer W is returned to a carrier C by the second transport mechanism 111.

As described above, it is possible to perform alternate film formation on the opposite sides of the convex portions by performing the film formation by transporting the substrate serially with respect to the plurality of film-forming apparatuses and the substrate rotation chambers located therebetween.

By performing film formation in this manner, each film-forming apparatus may perform sputtering film formation on one side of each of the convex portions of the trench pattern. Thus, the processing time in each film-forming apparatus is shortened compared to the case in which sputtering film formation is performed on opposite sides of each of the convex portions. For this reason, it is possible to suppress the retention of the substrate W when serially transporting the substrate W.

Some of the substrate rotation chambers may be replaced with processing apparatuses serving as a heating apparatus, a cooling apparatus, an etching apparatus, and the like. For example, the third substrate rotation chamber 133c may be replaced with a heating apparatus, and heat treatment may be performed between film formation in a certain film-forming apparatus and film formation in the next film-forming apparatus.

<Other Applications>

Although embodiments have been described above, it should be understood that the embodiments disclosed herein are illustrative and non-restrictive in all respects. The above-described embodiments may be omitted, replaced, or modified in various forms without departing from the scope and spirit of the appended claims.

For example, the methods of emitting sputter-particles in the above embodiments are examples, and sputter-particles may be emitted by other methods.

In the first embodiment, an example in which two targets (sputter-particle emitters) are provided has been described, but three or more targets may be provided. In the first embodiment described above, a case is described in which sputter-particles are emitted from one target while moving a substrate in one direction during alternate film formation, but sputter-particles may be alternately emitted from two targets while moving the substrate in one direction. In addition, although the articulated arm mechanism is used as the substrate moving mechanism in the first embodiment, the substrate movement is not limited thereto and may employ any mechanism (e.g., a belt conveyor) as long as it can move the substrate linearly. When a belt conveyor is used, the belt conveyor serves both as a substrate support and as a substrate moving mechanism.

In addition, the film-forming systems of the second to fifth embodiments are merely illustrative. For example, in the second embodiment, at least one film-forming apparatus may be provided, and in the third embodiment, the number of first film-forming apparatuses 102a and/or the number of second film-forming apparatuses 102b' may be two or more. In addition, in the fourth embodiment, the number of either or both of the film-forming apparatuses may be two or more. In addition, in the second to fifth embodiments described above, a case is illustrated in which only one sputter-particle emitter is provided for performing oblique film formation using a film-forming apparatus, but a plurality of sputter-particle emitters may be provided.

According to the present disclosure, it is possible to perform sputtering film formation with a high degree of freedom on the basis of oblique film formation.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film-forming method of forming a predetermined film by a film-forming apparatus, which comprises: a processing chamber defining a processing space in which a film-forming process is performed on a substrate, a first sputter-particle emitter and a second sputter-particle emitter having targets, respectively, from which sputter-particles are emitted in different oblique directions in the processing space, a sputter-particle blocking plate having a passage hole through which the sputter-particles emitted from the first sputter-particle emitter and the second sputter-particle emitter pass, a substrate support configured to support the substrate and provided at a side opposite the first sputter-particle emitter and the second sputter-particle emitter with respect to the sputter-particle blocking plate in the processing space, and a substrate moving mechanism configured to linearly move the substrate supported on the substrate support, the film-forming method comprising:
   supporting the substrate on the substrate support;
   moving the substrate linearly;
   emitting the sputter-particles from the first sputter-particle emitter and the second sputter-particle emitter while the substrate is moved; and
   forming a film by causing the sputter-particles emitted from the first sputter-particle emitter and the second sputter-particle emitter to be incident on the substrate through the passage hole,
   wherein the sputter-particle blocking plate includes:
   a first passage hole through which the sputter-particles emitted from the first sputter-particle emitter pass;
   a second passage hole through which the sputter-particles emitted from the second sputter-particle emitter pass;
   a first fin provided in a vicinity of the first passage hole to guide the sputter-particles at a first predetermined angle; and
   a second fin provided in a vicinity of the second passage hole to guide the sputter-particles at a second predetermined angle,
   wherein a first incident angle of the sputter-particles which pass through the first passage hole is adjusted by adjusting the first predetermined angle of the first fin,
   wherein a second incident angle of the sputter-particles which pass through the second passage hole is adjusted by adjusting the second predetermined angle of the second fin, and
   wherein the first predetermined angle is different from the second predetermined angle.

2. The film-forming method of claim 1, wherein emitting the sputter-particles comprises:
   performing, alternately one or more times, an emission of the sputter-particles from the first sputter-particle emitter and an emission of the sputter-particles from the second sputter-particle emitter, and
   wherein the forming the film comprises:
   performing, alternately one or more times, a first film formation of forming a first film on the substrate by the sputter-particles emitted from the first sputter-particle emitter and a second film formation of forming a second film on the substrate by the sputter-particles emitted from the second sputter-particle emitter.

3. The film-forming method of claim 2, wherein the substrate moving mechanism is configured to:
move the substrate in a first direction while the sputter-particles are emitted from the first sputter-particle emitter; and
move the substrate in a second direction, which is opposite the first direction, while the sputter-particles are emitted from the second sputter-particle emitter.

4. The film-forming method of claim 1, wherein growth directions of a first film and a second film formed on the substrate are controlled by setting an emission output of the sputter-particles from the first sputter-particle emitter and an emission output of the sputter-particles from the second sputter-particle emitter to be different from each other.

5. The film-forming method of claim 1, wherein growth directions of a first film and a second film formed on the substrate are controlled by setting an angle of the sputter-particles emitted from the first sputter-particle emitter to be incident on the substrate and an angle of the sputter-particles emitted from the second sputter-particle emitter to be incident on the substrate to be different from each other.

6. The film-forming method of claim 1, wherein the target of the first sputter-particle emitter and the target of the second sputter-particle emitter are formed of different materials, and
a first film and a second film formed on the substrate are formed of different materials.

7. The film-forming method of claim 1, wherein, in the emitting the sputter-particles, an emission of the sputter-particles from the first sputter-particle emitter and an emission of the sputter-particles from the second sputter-particle emitter are simultaneously performed, and
wherein, in the forming the film, the film is formed on the substrate by the sputter-particles simultaneously emitted from the first sputter-particle emitter and the second sputter-particle emitter.

8. The film-forming method of claim 7, wherein forming the film is controlled by adjusting an arrangement and an angle of the target of the first sputter-particle emitter, and an angle of the sputter-particles emitted from the first sputter-particle emitter and the second sputter-particle emitter to be incident on the substrate.

9. A film-forming method of forming a predetermined film by a film-forming system, which comprises: a first film-forming apparatus including a first sputter-particle emitter configured to obliquely emit sputter-particles in a first direction, and configured to perform sputtering film formation on a substrate by emitting the sputter-particles from the first sputter-particle emitter while linearly moving the substrate in a first linear direction, a second film-forming apparatus including a second sputter-particle emitter configured to emit the sputter-particles in a second direction, which is opposite the first direction, and configured to perform sputtering film formation on the substrate by emitting the sputter-particles from the second sputter-particle emitter while linearly moving the substrate in a second linear direction, and a transporter configured to transport the substrate between the first film-forming apparatus and the second film-forming apparatus, the film-forming method comprising:
performing, by the first film-forming apparatus, a first sputtering film formation on the substrate by emitting the sputter-particles from the first sputter-particle emitter while linearly moving the substrate in the first linear direction;
transporting the substrate to the second film-forming apparatus by the transporter; and
performing, by the second film-forming apparatus, a second sputtering film formation on the substrate by emitting the sputter-particles from the second sputter-particle emitter while linearly moving the substrate in the second linear direction,
wherein the first film-forming apparatus includes a first sputter-particle blocking plate,
wherein the first sputter-particle blocking plate includes:
a first passage hole through which the sputter-particles emitted from the first sputter-particle emitter pass; and
a first fin provided in a vicinity of the first passage hole to guide the sputter-particles at a first predetermined angle,
wherein a first incident angle of the sputter-particles which pass through the first passage hole is adjusted by adjusting the first predetermined angle of the first fin,
wherein the second film-forming apparatus includes a second sputter-particle blocking plate,
wherein the second sputter-particle blocking plate includes:
a second passage hole through which the sputter-particles emitted from the second sputter-particle emitter pass; and
a second fin provided in a vicinity of the second passage hole to guide the sputter-particles at a second predetermined angle,
wherein a second incident angle of the sputter-particles which pass through the second passage hole is adjusted by adjusting the second predetermined angle of the second fin, and
wherein the first predetermined angle is different from the second predetermined angle.

10. The film-forming method of claim 9, wherein the first linear direction of the first film-forming apparatus and the second linear direction of the second film-forming apparatus are opposite to each other with respect to a loading/unloading port configured to load/unload the substrate by the transporter.

* * * * *